(12) United States Patent
Ivanov et al.

(10) Patent No.: US 8,415,704 B2
(45) Date of Patent: Apr. 9, 2013

(54) CLOSE-PACKED ARRAY OF LIGHT EMITTING DEVICES

(75) Inventors: Ilia N. Ivanov, Knoxville, TN (US); John T. Simpson, Clinton, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 402 days.

(21) Appl. No.: 12/924,217

(22) Filed: Sep. 22, 2010

(65) Prior Publication Data

US 2012/0068206 A1 Mar. 22, 2012

(51) Int. Cl.
*H01L 33/00* (2010.01)

(52) U.S. Cl. .................................. 257/99; 257/E33.066

(58) Field of Classification Search ........................ None
See application file for complete search history.

(56) References Cited

U.S. PATENT DOCUMENTS

| | | |
|---|---|---|
| 6,185,961 B1 | 2/2001 | Tonucci et al. |
| 6,720,737 B1 | 4/2004 | Hsiung |
| 6,799,864 B2 | 10/2004 | Bohler et al. |
| 7,071,493 B2 | 7/2006 | Owen et al. |
| 7,095,053 B2 | 8/2006 | Mazzochette et al. |
| 7,345,320 B2 | 3/2008 | Dahm |
| 2003/0132529 A1* | 7/2003 | Yeo et al. ...................... 257/778 |
| 2005/0225222 A1 | 10/2005 | Mazzochette et al. |
| 2007/0291490 A1 | 12/2007 | Tajul et al. |
| 2008/0117278 A1 | 5/2008 | Oehlbeck et al. |

FOREIGN PATENT DOCUMENTS

| | | |
|---|---|---|
| JP | 2006-013324 A | 1/2006 |
| JP | 2006-074007 A | 3/2006 |
| JP | 2008-204776 A | 9/2008 |
| KR | 10-20090046672 A | 5/2009 |

OTHER PUBLICATIONS

International Search Report and Written Opinion of the International Searching Authority for PCT/US2011/052310; Date of Mailing: Apr. 19, 2012; 6 pages.

* cited by examiner

*Primary Examiner* — Ha Tran T Nguyen
*Assistant Examiner* — Kevin Quinto
(74) *Attorney, Agent, or Firm* — Brinks Hofer Gilson & Lione (57) ABSTRACT

A close-packed array of light emitting diodes includes a non-conductive substrate having a plurality of elongate channels extending therethrough from a first side to a second side, where each of the elongate channels in at least a portion of the substrate includes a conductive rod therein. The conductive rods have a density over the substrate of at least about 1,000 rods per square centimeter and include first conductive rods and second conductive rods. The close-packed array further includes a plurality of light emitting diodes on the first side of the substrate, where each light emitting diode is in physical contact with at least one first conductive rod and in electrical contact with at least one second conductive rod.

28 Claims, 7 Drawing Sheets

CLOSE-PACKED ARRAY OF LIGHT EMITTING DEVICES

FEDERALLY SPONSORED RESEARCH OR DEVELOPMENT

This invention was made with government support under Contract No. DE-AC05-00OR22725 awarded by the U.S. Department of Energy. The government has certain rights in the invention.

TECHNICAL FIELD

The present disclosure is directed generally to light emitting diodes and more particularly to a close-packed array of such devices.

BACKGROUND

A light-emitting diode (LED) is an electronic light source based on a semiconductor diode (p-n junction) that may be used in a variety of applications, including as replacements for traditional light source devices. An LED may include an anode and cathode disposed on a chip of semiconductor material. When a diode is forward biased, charge carriers, including electrons and holes, flow through the semiconductor between the anode and cathode. When electrons and holes recombine, they release energy in the form of a photon. The color of the light corresponds to the energy of the photon, which in turn depends on the band gap of the semiconductor.

LEDs are becoming increasingly popular as light source devices, especially as their cost continues to decrease. Typical LED applications utilize a plurality of LEDs to produce the required total light intensity. However, the process of producing light from LEDs may be inefficient, particularly at the power levels needed for practical lighting applications, with a substantial amount of the electrical energy being converted into heat energy. Therefore, the temperature of the chip rises as the LEDs produce light. Because of this temperature increase, the amount of light produced by the LEDs and the efficiency of the LEDs decrease. If the temperature continues to rise, the LED chip may eventually fail as the actual chip temperature exceeds the maximum junction temperature for the chip.

The heat generated by the LEDs and the risk of failure becomes even more significant when the LEDs are densely concentrated on the chip. Currently, manufacturers use heat sinks and increase the spacing between LEDs to reduce the temperature of the chip. These techniques, however, may cause an undesirable increase in the size and power usage of the LED device, thereby limiting their application.

In view of the above, it is apparent that there exists a need for an improved LED array that can provide effective heat dissipation while accommodating a close spacing between individual LEDs.

BRIEF SUMMARY

A close-packed array of LEDs configured for directional heat dissipation is described here. The flexible design platform may allow for effective thermal management and efficient light production from a large number of closely spaced LEDs.

The close-packed array includes a nonconductive substrate having a plurality of elongate channels extending therethrough from a first side to a second side, where each of the elongate channels in at least a portion of the substrate includes a conductive rod therein, where the conductive rods include first conductive rods and second conductive rods. The conductive rods have a density over the substrate of at least about 1,000 rods per square centimeter. The close-packed array further includes a plurality of light emitting diodes on the first side of the substrate, where each light emitting diode is in physical contact with at least one of the first conductive rods and in electrical contact with at least one of the second conductive rods.

DETAILED DESCRIPTION

Glass drawn fibers are utilized to produce a plurality of glass sealed electrodes that can serve as the basis of a thermal, electrical and light management scheme for an array of light emitting diodes (LEDs). Although individual LEDs generally emit a fairly narrow band of light (e.g., red, green, or blue), the array of LEDs described here may be advantageously configured for white light emission. Furthermore, the heat dissipation provided by the glass sealed electrodes may permit dense packing of the LEDs without compromising efficiency of operation. The size, spacing and geometry of the electrodes in the array may be varied to manage the light output and the thermal load of the LEDs.

Figure 1:
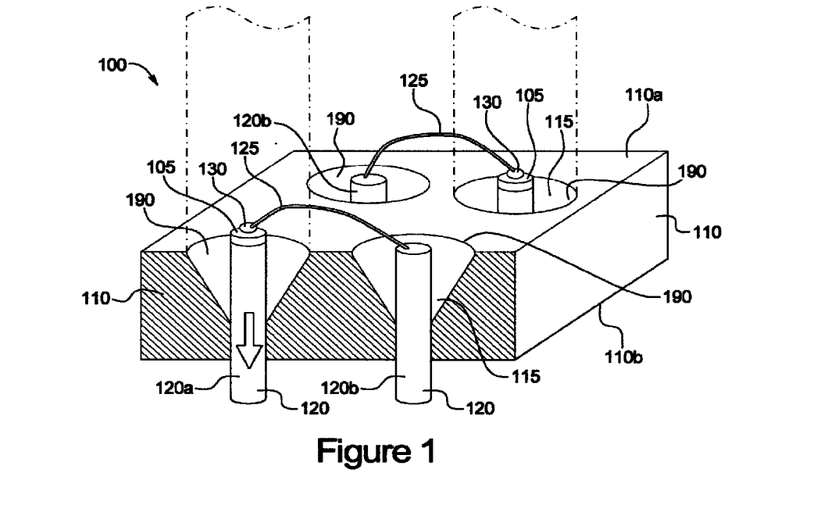
FIG. 1 is a schematic of a portion of an exemplary array of light emitting diodes (LEDs)

FIG. 1 shows a portion of a close-packed array 100 of LEDs 105 arranged on a first side 110a of a nonconductive substrate 110. The substrate 110 has a plurality of elongate channels 115 extending therethrough from the first side 110a to a second side 110b, and each channel 115 in at least a portion of the substrate contains a conductive rod 120, which may be both thermally and electrically conductive. The plurality of conductive rods comprise first conductive rods 120a, which are in physical (direct) contact with the LEDs 105, and second conductive rods 120b, which are electrically connected to but not in physical contact with the LEDs 105. The first conductive rods 120a may function as electrodes (e.g., anodes) and heat pipes for the LEDs 105, and the second conductive rods 120b may serve as electrodes (e.g., cathodes) and conduits for anisotropic dissipation of heat from the substrate 110. When the nonconductive substrate (or matrix) 110 is formed of glass, the first and second conductive rods 120a, 120b may be referred to as glass-sealed electrodes, although the nonconductive substrate 110 may be formed of materials other than glass, as discussed further below.

Each LED 105, which typically comprises thin layers or nanostructures, may be either directly formed on or mounted on one of the first conductive rods 120a. For example, an LED 105 may be mounted on and bonded to one of the first conductive rods 120a by a conductive paste. Alternatively, vapor deposition and patterning techniques may be employed form p-n junctions directly on the first conductive rods. The ratio of LEDs 105 to first conductive rods 120a is typically 1:1, and the substrate 110 may include the same number of second conductive rods 120b as first conductive rods 120a. However, in alternative embodiments, the ratio of first conductive rods to second conductive rods may be greater than or less than one depending on the thermal load created by the LEDs and the array geometry utilized to provide thermal management. Also, there may be additional conductive rods ("third conductive rods") present in the nonconductive matrix that are not electrically or physically connected to the LEDs but serve a heat dissipation function, as discussed further below.

To establish electrical contact between the LED 105 and the second conductive rod 120b, an electrical connection (e.g., wire) 125 may extend from the LED 105 to an exposed portion of the rod 120b. For example, the wire 125 may extend from a p-type region of the LED 105 to an end of the second conductive rod 120b. Referring to FIG. 1, the wire 125 may extend from a wire bond 130 on the LED 105 over the first side of the substrate to a wire bond 135 on the second conductive rod 120b. In this example, the wire 125 is not directly in contact with the substrate 110. Alternatively, it is possible for the electrical connection 125 to be formed (e.g., by vapor deposition and patterning) to lie directly on the first side 110a of the substrate 110 between the LED 105 and the second conductive rod 120b.

Figure 2:
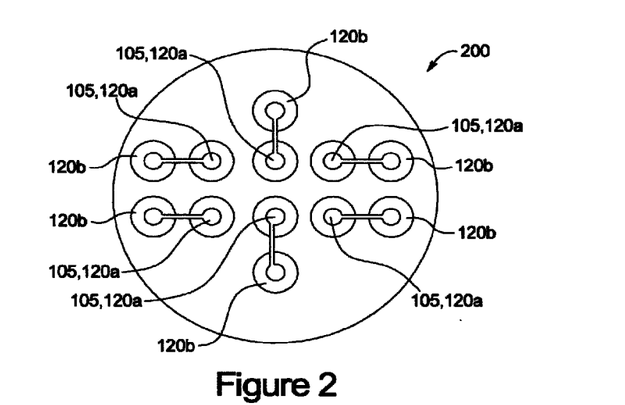
FIG. 2 shows a top view of an exemplary array of six LEDs.

FIG. 2 shows a top view of an exemplary array 200 of six LEDs 105 overlying six first conductive rods 120a and electrically connected to six second conductive rods 120b. Due to the built-in heat pipe system offered by the conductive rods, heat generated by the LEDs may be removed anisotropically from the front side of the nonconductive substrate and dissipated along the rods to the back side of the substrate. Thus, LEDs of different colors (e.g., red, blue and green) may be spaced closely enough together for their light to blend and appear as white light to the eye. Without the thermal management provided by the conductive rods, such a close-packed LED array could rapidly overheat during operation due to the high current density and burn itself out. By controlling the colors of the individual LEDs, their spacing, and the power supplied thereto, the color of light output by the array may be tuned as desired.

Figure 3:
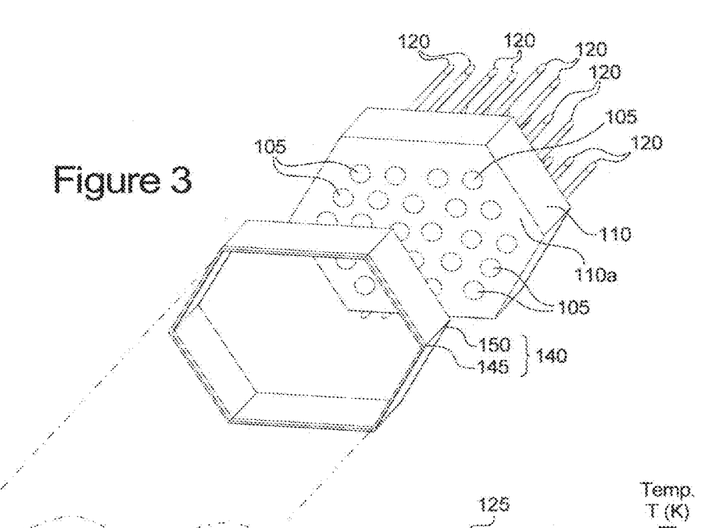
FIG. 3 is a schematic of an exemplary multi-LED socket positioned in opposition to a phosphor material for color tuning.

Another strategy for color management of the LED array entails positioning a phosphor glass (luminescent glass) 140 in opposition to a first side 110a of the substrate 110, as shown for example in FIG. 3. Light emitted from the array of LEDs 105 acts as an excitation source for the phosphor glass 140, and the LED color(s) may be tuned up to produce white light. The phosphor glass 140 may be formed, for example, by depositing a phosphorescent coating 145 on a glass substrate 150.

The conductive rods that serve as heat pipes and/or electrodes in the LED array may be fabricated to have any desired length, as discussed below, and the thickness (or diameter in the case of rods having a circular cross-section) may also be controlled. Generally, to balance packing the LEDs as closely together as possible with attaining desired current levels and efficiently conducting heat away from the LEDs, the spacings among the LEDs may be balanced with the length and thickness of the conductive rods. That is, an increase in the length and/or thickness of the conductive rods may be used to compensate for progressively smaller spacings within the array. The spacing between adjacent LEDs is determined by the spacing between adjacent channels in the nonconductive substrate, which in turn depends on the drawing process used to form the nonconductive substrate from bundles of glass or polymer tubes of a given wall thickness, as discussed further below. Accordingly, using the improved array and method described here, traditional limits on the size and spacing of LEDs due to concerns about overheating may be circumvented.

Typically, the conductive rods have a thickness (or diameter) of between about 1 micron and 500 microns. More typically, the thickness or diameter is between about 20 microns and 200 microns. For example, the thickness may lie in the range of from about 50 microns to 100 microns. The conductive rods may have any desired length. Generally, the conductive rods are formed of a refractory metal such as molybdenum or tungsten.

Figure 4:
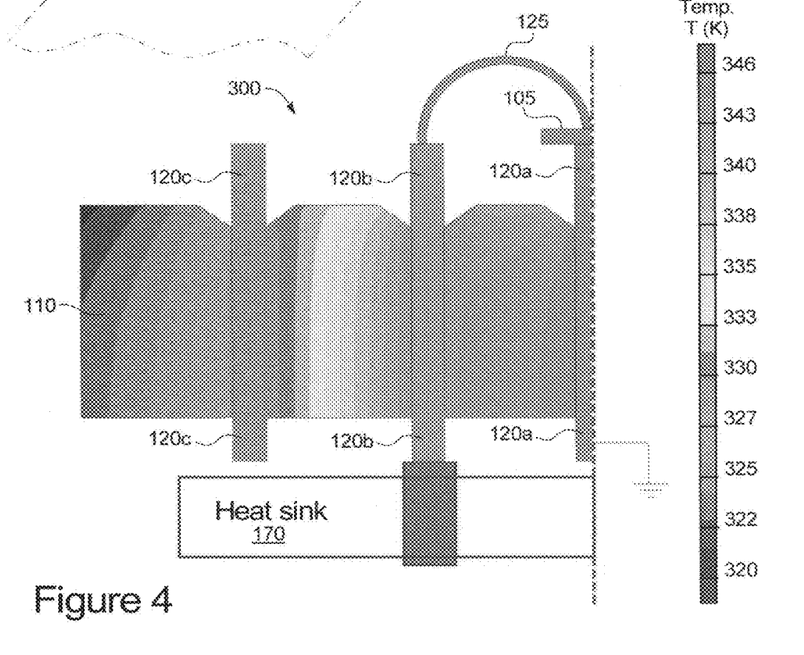
FIG. 4 shows a cross-sectional view and thermal map of a portion of an exemplary LED socket 300 including three conductive rods.

FIG. 4 shows a cross-sectional view and thermal map of a portion of an exemplary LED socket 300 including three conductive rods (a first conductive rod 120a, a second conductive rod 120b, and a third conductive rod 120c) in a glass substrate for heat dissipation from the LED 105. The LED chip 105 is mounted on the first conductive rod 120a, which also functions as an electrode, and the second conductive rod 120b is electrically connected to the LED 105 by way of a wire 125. A plane of symmetry passes through the axis of symmetry of the first conductive rod 120a and LED 105, and thus only a portion of the LED socket 300 is shown. The thermal map was generated by QuickField Finite Elements Analysis Software from Terra Analysis. The regions that appear red have the highest temperature. The thermal map indicates that some passive convective and conductive cooling with the LED socket itself allows establishing a gradient of temperatures through the glass. For the modeled materials, the temperature of the socket 300 shows a gradient of about 26 degrees at a distance corresponding to ten rod diameters from the first conductive rod 120a.

Generally speaking, the ratio of (a) the number of LEDs in the array to (b) the number of conductive rods in the array is about 1:n, where n is an integer equal to 2 or greater, and the number of third conductive rods is equal to n−2. For example, the ratio of LEDs to conductive rods may lie between 1:2 and 1:50, where the number of third conductive rods for each LED is at most 48. In some embodiments, the ratio of LEDs to conductive rods may be between 1:2 and 1:20 (at most 18 third conductive rods for each LED), or between 1:2 and 1:10 (at most 8 third conductive rods for each LED). The ratio of LEDs to conductive rods may also lie between 1:3 and 1:8, or between 1:3 and 1:6.

Depending on the size of the LED and the diameter of the conductive rods, the cooling of the LED may be improved if two or more conductive rods are in direct contact with the LED. As shown for example in FIG. 5, two conductive rods 120a, 120a' may underlie the LED, with both rods serving as heat pipes and one of the two rods (the first conductive rod 120a) further acting as an electrode connected to a power supply. The additional conducting rod(s) 120a' may be electrically insulated from the LED by way of a heat conducting but electrically insulating coating, as discussed in greater detail below.

In another example in which the thermal load of the LEDs is not as high as in the previous embodiment, the LEDs may be spaced more closely and a single first conductive rod in contact with each LED may provide sufficient heat dissipation. In this case, there may be a higher number of first conductive rods than second conductive rods. For example, a hexagonal geometry of rods may include a second conductive rod as the central rod with the surrounding rods being first conductive rods, each of which underlies an LED. There may be a plurality of electrical connections between the surrounding LEDs and the central second conductive rod. The second conductive rod may also help to dissipate heat from the nonconductive matrix, but the majority of the heat dissipation in this example is provided by the first conductive rods. The ratio of LEDs to second conductive rods in this embodiment is 6:1, and generally speaking the ratio may be between about 2:1 and 10:1.

Figure 6A:
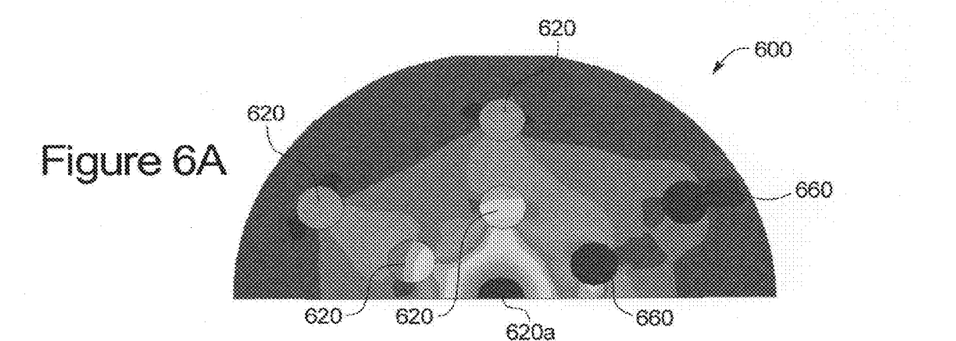
FIGS. 6A and 6B provide top-view thermal profiles (heat map and temperature map, respectively) for a first exemplary LED socket including both conductive rods and convective channels.
Figure 6B:
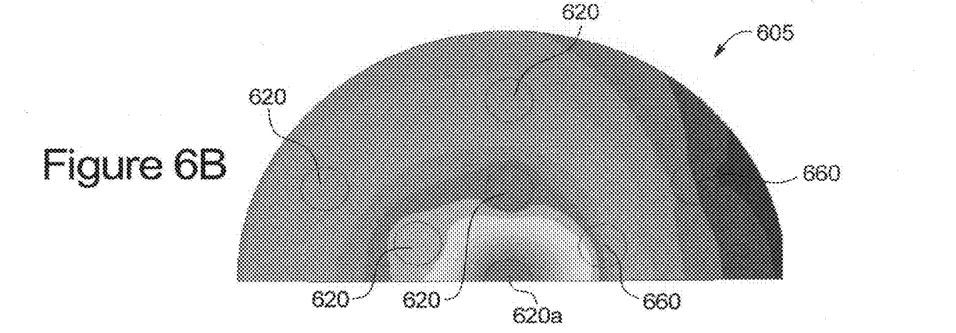

Convective channels may be included in the nonconductive matrix in addition to the conductive rods to provide an additional means for dissipating heat and controlling the temperature profile over the nonconductive matrix. The convective channels are throughholes in the matrix through which air or another cooling fluid may be forced to provide convective cooling. Referring to the top-view thermal profiles of FIGS. 6A and 6B, which include a heat flux map 600 and a temperature map 605 of a portion (one-half) of an exemplary LED socket, it can be seen that heat flux is highest in the direction toward the conductive rods 620 and lowest towards the convective (air-filled) channels 660, where convective flow is organized. In the exemplary socket corresponding to the heat flux and temperature maps, nine conductive rods, including a centrally-positioned first conductive rod, and four convective channels are employed. Other ratios of conductive rods and convective channels are possible. For example, the nonconductive matrix may include a ratio of conductive rods to convective channels of at least about 1.5:1. The ratio may also be at least about 2:1, at least about 3:1, or at least about 5:1. In some embodiments the ratio may be at least about 10:1. The convective channels may be formed by etching, for example.

Figures 7A, 7B:
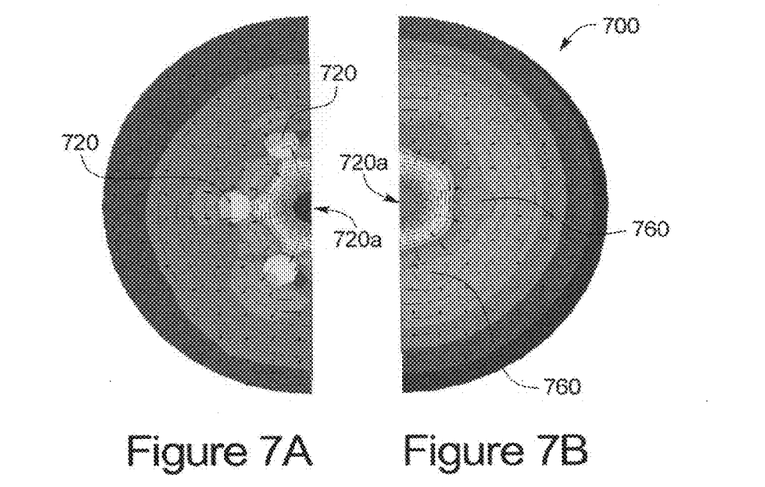
FIGS. 7A and 7B provide top-view thermal profiles (heat field and temperature field, respectively) for a second exemplary LED socket that includes both conductive rods and convective channels.

FIGS. 7A and 7B provide top-view thermal profiles (heat field and temperature field, respectively) of a portion of an LED socket 700 that includes both conductive rods 720 and convective channels 760 arranged in a hexagonal geometry with the first conductive rod/LED 720a at the center. Although the conductive rods 720 and convective channels 760 surrounding the LED are not, in direct (physical) contact with the LED, they help to remove heat from the nonconductive matrix and permit directional cooling toward the back of the substrate. In this example, the ratio of conductive rods to conductive channels is 4:3. The ratio of LEDs to conductive rods is 1:4, where two of the conductive rods are third conductive rods, and only the first and second conductive rods are electrically connected to the LED.

The preceding figures show conductive rods and convective channels having a circular transverse cross-section; however, other shapes are possible. For example, the transverse cross-section of the channels and/or rods may be formed to be polygonal (e.g., pentagonal or hexagonal) or oval in shape. Typically, the conductive rods and convective channels are arranged in an ordered array in which there is a substantially similar spacing between adjacent channels 115 of the nonconductive substrate 110 throughout the array.

Figure 5:
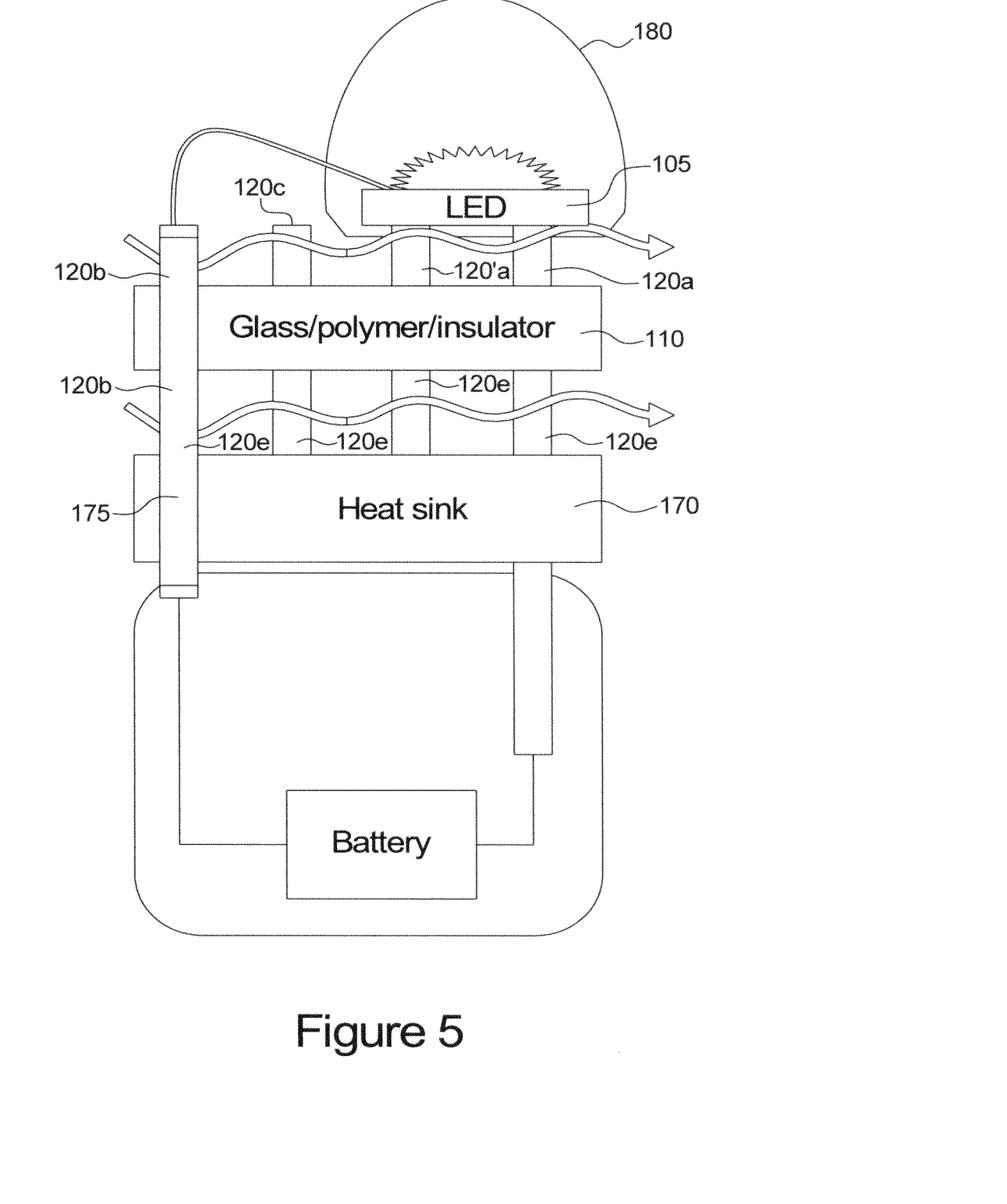
FIG. 5 shows a portion of an exemplary LED array and heat management system.

The thermal management system may further include a heat sink 170 in contact with or adjacent to the back side 110b of the nonconductive matrix 110, as shown, for example, in FIG. 5. The heat sink 170 may be in contact with some or all of the conductive rods 120 to assist in the heat dissipation from the LED(s) 105. Typically, the heat sink 170 is formed from aluminum or copper or from a material with similar thermal properties.

In addition, a portion of the conductive rods 120 may be exposed (e.g., by etching of the matrix 110) to function as high surface area "fins" 120e for heat exchange. A cooling fluid (e.g., air, helium, water, etc.) pumped through the region around the exposed portions 120e of the rods serves to provide convective cooling that enhances the anisotropic heat conduction provided by the rods 120. The exposed regions (or fins) 120e of the conductive rods 120 may lie between the LED(s) 105 and the front side of the substrate 110a and/or between the heat sink 170 and the back side of the substrate 110a. The surface area available for heat exchange depends the number and diameter of exposed portions 120e and on the length of the exposed portions 120e. For example, in the case of conductive rods of 100 microns in diameter having exposed portions of 2 cm in length, the surface area available for convective cooling is about $6.3 \times 10^{-7}$ m$^2$. With a number density of 1000 rods in the nonconductive matrix, the surface area available for heat exchange is about $6.3 \times 10^{-4}$ m$^2$. The exposed portions are generally envisioned to have lengths of between about 0.5 mm and about 1 cm. In an exemplary wet etching process, dilute hydrofluoric (HF) acid is employed to carve out the exposed portions of the rods. The concentration of the dilute HF acid may vary, but 1% to 50% is typical, with the preferred concentration ranging from 5% to 10%.

Each of the first and second conductive rods, which are electrically connected to the LED, may include a thermally conducting but electrically insulating coating 175 over all or a portion of the surface of the rod. Any third conductive rods used in the nonconductive matrix may also include such a coating. The thermally conducting but electrically insulating coating 175 may be particularly advantageous when a portion of the rods are exposed as described above to provide a path for fluid flow around the rods. If water or another electrically conducting fluid is employed, the coating may prevent a short between the wires. The coating may be formed in part or in full of alumina, aluminum nitride, boron nitride, diamond and/or sapphire, for example, and may be applied to the rods either prior to the fiber drawing process (described below) or after the nonconductive matrix is etched to form the exposed portions for convective cooling. The coating may further include superhydrophobic characteristics. The LED itself may also be insulated from the surrounding environment by, for example, encapsulation within a substantially transparent material 180, as illustrated schematically in FIG. 5.

As discussed above, the conductive rods 120 may be both thermally and electrically conductive. For example, the conductive rods 120 may be made of a metal, such as a refractory metal. It is also contemplated that one or more of the conductive rods may be thermally conductive but electrically nonconductive (electrically insulating). In this case, some or all of the conductive rods 120 may be made of a thermally conductive but electrically insulating material (e.g., a ceramic such as aluminum oxide or aluminum nitride). For example, one or more of the first conductive rods 120a may be made of a thermally conductive ceramic. According to this embodiment, the LED may be electrically connected by way of two electrical connections 125 to two second conductive rods 120b (which are not in physical contact with the LED), where one second conductive rod functions as an anode and the other functions as a cathode. Referring to FIG. 1, for example, which shows a portion of a close-packed array 100 of LEDs 105 arranged on a first side 110a of a nonconductive substrate 110, a second electrical connection (wire) 125 would extend from the first conductive rod 105 to a different second conductive rod 120b according to this alternative embodiment.

As used in the present application, the term "thermally conductive" may be applied to materials and/or components having a thermal conductivity of at least about 15 W/m·K. Advantageously, "thermally conductive" refers to a material and/or component having a thermal conductivity of at least about 25 W/m·K. The term "electrically conductive" may be applied to materials and/or components having an electrical conductivity of at least about $1\times10^6$ $(\Omega\cdot m)^{-1}$, where electrical conductivity is the inverse of electrical resistivity. Electrically nonconductive or electrically insulating materials may have an electrical resistivity of greater than $1\times10^8$ $\Omega\cdot m$, typically greater than about $1\times10^{10}$ $\Omega\cdot m$, or greater than about $1\times10^{12}$ $\Omega\cdot m$.

Referring again to FIG. 1, the first side 110a of the substrate 110 may further include a plurality of conical openings 190 contiguous with the ends of the channels 115. Each conical opening 190 enlarges the end 115a of a channel 115 and encircles a first or second conductive rod 120a, 120b. Conical openings 190 encircling the first conductive rods 120a (which are in contact with the LEDs 105) help to direct light emitted from the LEDs 105 in a desired direction and reduce light losses. The openings 190 may also reduce mechanical stresses at the interface between the conductive rod and the surface of the nonconductive matrix, as discussed further below.

Figure 8A:
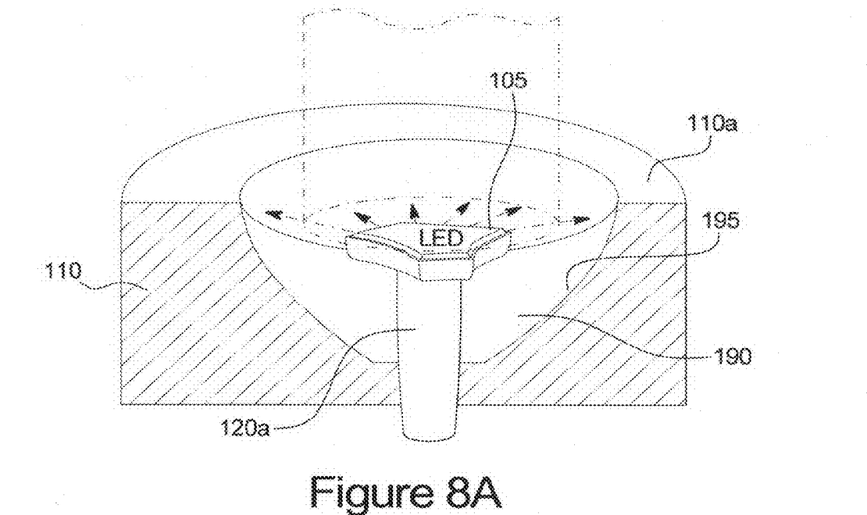
FIG. 8A is a schematic showing a conical opening formed in the non-conductive substrate and surrounding a conductive rod.
Figure 8B:
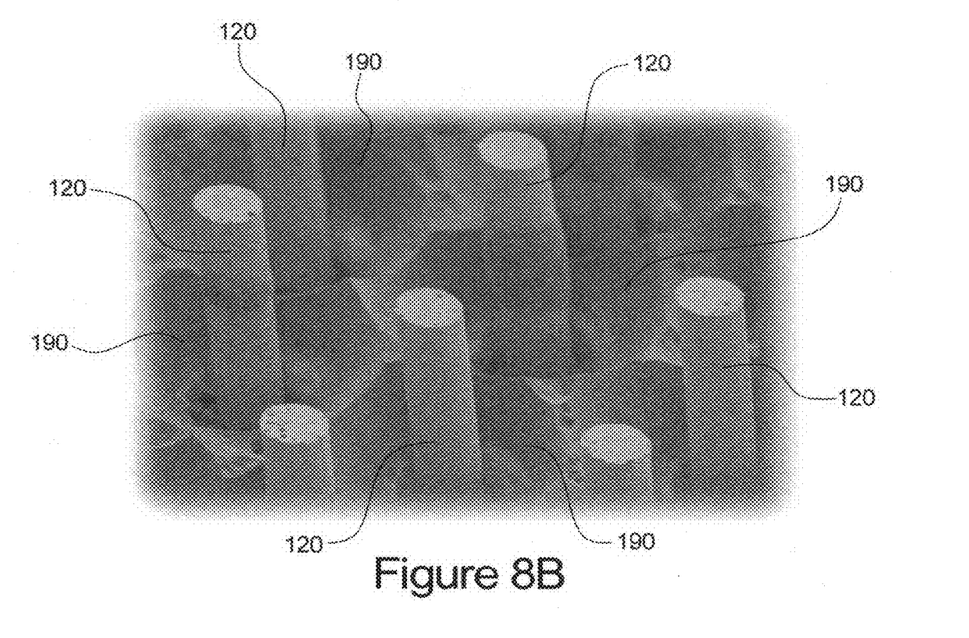
FIG. 8B is a scanning electron micrograph showing conical openings formed in the glass substrate and surrounding 75-micron-diameter tungsten rods.

The term "conical opening" refers broadly to an opening of any shape that radially enlarges the end of a channel in a direction away from the substrate. For example, the conical opening 190 may be conical in shape, as shown in FIG. 1, or it may be parabolic (e.g., bowl-shaped), as shown in FIGS. 8A and 8B. The conical openings 190 may be formed by etching, as described U.S. Patent Application Publication 2003/0056714A1 and U.S. Pat. No. 4,285,892 for example, both of which are hereby incorporated by reference in their entirety. Typically, the conical opening 190 spans an angle of between about 10 degrees and about 80 degrees with respect to the axis of the channel 115. The angle may also be between about 30 degrees and about 60 degrees. The conical opening 190 may be symmetric or asymmetric with respect to the axis of the channel 115, where asymmetric conical openings span a range of angles with respect to the axis of the channel, depending on circumferential position. The LEDs 105 may not be in contact with the substrate 110, particularly when the conical openings 190 are present in the first side 110a of the substrate 110.

The conical opening 190 may include a reflective coating 195 thereon to enhance the amount of light reflected from the LED 105 in the desired direction. The reflective coating may be formed of a high reflectivity material such as aluminum, silver or gold, and the coating may be deposited on the conical opening 190 by vapor deposition or another thin film coating technique. The use of the conical opening with the reflective coating minimizes or eliminates the need for additional optics above the LED, which may be a side-emitting LED or a top surface-emitting LED.

Figure 9A:
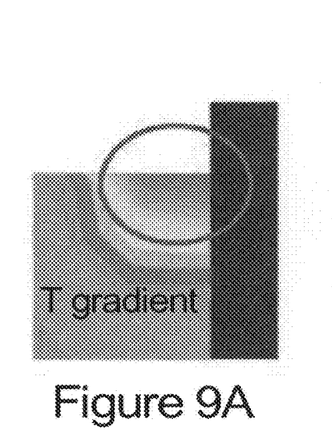
FIGS. 9A and 9B are schematics of the temperature gradient in the vicinity of the rod-matrix interface without and with a conical opening, respectively.
Figure 9B:
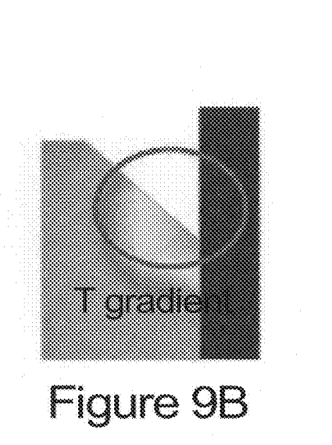
Figure 10:
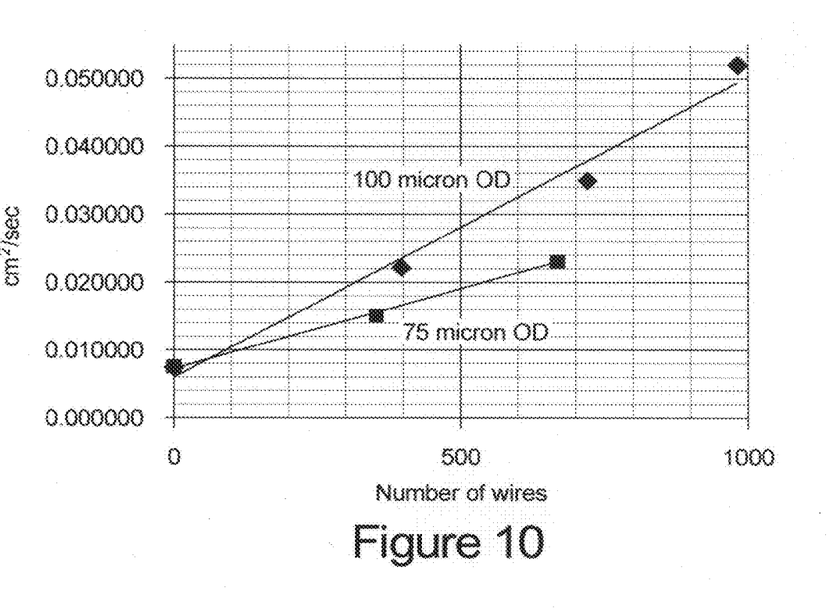
FIG. 10 is a graphical representation of thermal diffusivity data obtained from a number of glass-tungsten rod composite specimens.

Another benefit of the conical opening is a reduced temperature gradient at the interface between the conductive rod and the surface of the matrix, which leads to a decrease in thermal and mechanical stress at the interface. FIGS. 9A and 9B are schematics of the temperature gradient in the vicinity of the rod-matrix interface without and with a conical opening, respectively. The thermal maps were generated by an InSb imaging camera (FLIR) from the back of the glass-conductive rod composite after the flash of light deposited heat on the surface of the composite covered with graphite powder for even heat absorption. The regions that appear red have the highest temperature. It can be seen that the gradient in temperature at the junction drops significantly with the change in geometry afforded by the conical opening.

For additional heat dissipation, a spacing may be created between the conductive rods 120 and the nonconductive matrix 110 and then filled with a thermally conductive gas or liquid. For example, wet or dry etching may be employed to carve out a portion of the nonconductive substrate around some or all of the conductive rods, thereby forming the desired spacing between the substrate and the rods. Suitable thermally conductive fluids for incorporation within the spacing may include, for example, water or oil.

Drawing Process

A fiber draw tower at Oak Ridge National Laboratory has been employed to draw glass tubes including refractory metal conductive rods into drawn fibers. A top section of the fiber draw tower holds and lowers the preform for drawing. A furnace underlies the top section, followed by a laser micrometer and traction pullers. At the base is a blade that cuts the drawn fiber into segments.

The method employs a series of drawing and cutting operations to encapsulate conductive rods within channels of glass or plastic to form a close-packed array of conductive rods in a nonconductive matrix, or substrate. Since the conductive rods are intended to dissipate heat from a close-packed array of LEDs, the conductive rods are typically formed from a material having a high thermal conductivity and melting point. For example, refractory metal wire, such as molybdenum or tungsten wire, may be suitable for forming the conductive rods. These materials are also electrically conductive. If thermal conductivity but electrical insulation is desired from the conductive rods, then materials such as thermally conductive ceramics, e.g., aluminum oxide or aluminum nitride, may be suitable, as discussed above.

The array begins as a single nonconductive tube (for example a 9 mm outer diameter and 2.2 mm inner diameter Pyrex capillary tube) along with a length of a metal wire having a diameter smaller than the inside diameter of the tube (for example, a 75 micron-diameter tungsten or molybdenum wire). The nonconductive tube may be a capillary tube made of a glass or polymer. Suitable glasses may include, for example, borosilicate glass or soda-lime glass, and suitable polymers may be polystyrene or polymethylmethacrylate. The wire is threaded at least partially through the tube and drawn in a fiber draw tower into a drawn fiber (for example, a 0.3 mm diameter fiber). During the drawing process, the metal wire is pulled along with the glass tube and is incorporated into the drawn glass fiber. The length of the tube increases during drawing, while the outer diameter and the wall thickness of the tube decrease. In effect, a uniform glass coating is being formed around the refractory metal wire by pulling the wire through a semi-molten glass tube as the tube is drawn. If a refractory metal or other nondrawable material is employed for the metal wire, the wire may not be reduced in size during drawing, and thus the diameter of the wire may be substantially the same as that of the wire on the spool. The drawing parameters may be chosen such that, in the absence of the metal wire, the inside diameter of the drawn tube is similar to or smaller than the diameter of the wire. In general, drawing is carried out multiple times if the conductive inner core is either drawable or can be made to appear drawable (i.e., can be reduced in cross-sectional area).

After the initial draw, the drawn fiber including the metal wire is cut into segments and bundled together in preparation for a second bundled draw, which is intended to substantially fuse together the fiber segments to form an array of metal wires within a nonconductive matrix. In the case of using refractory metal wires, this step may be referred to as fiber fusion instead of a second "draw" since the bundled fiber being drawn is only slightly reduced in diameter. The reduction is due primarily to the elimination of air around the individual segments as opposed to a reduction in the diameter of individual segments. If desired, after the second draw or fusion, the nonconductive matrix may be cut into segments and bundled one or more additional times to include a larger number of wires in the array, and a third (or $n^{th}$) draw and/or fusion may be carried out (where n is an integer between 2 and 10). The expanse of the array is limited only by the number of times the cutting, bundling and drawing/fusion is carried out. The tube or bundle is typically but not necessarily cut in a direction perpendicular to the drawing direction.

In preparation for the first or successive draws, the tube or bundle, which may be called a "preform," is heated until it softens, and then it is drawn down to a reduced outer diameter. Typically, the desired outer diameter is in the range of from about 0.1 mm to about 1 mm, or from about 0.25 mm to about 0.75 mm, to permit ease of handling. For example, an outer diameter of about 0.5 mm (500 microns) may be suitable. Prior to drawing, the tube or bundle may have an outer diameter in the range of from about 10 mm to about 40 mm, and thus a drawing ratio of from about 20 to about 70 is generally achieved, where the drawing ratio is equal to the starting outer diameter divided by final outer diameter. As noted above, the conductive rods may be formed of a substantially non-drawable material, and thus the diameter or thickness of the rods may not be substantially altered during the drawing process. Accordingly, conductive rods of the size desired for use in the LED array may be employed from the outset. Typically, the wire employed in the drawing process has a diameter in the range of from about 1 micron to about 100 microns, and thus the conductive rods of the array have a diameter ranging from about 1 micron to about 100 microns.

The temperature at which the preform is heated prior to drawing is typically sufficient to soften but not melt the material comprising the tube, so as to maintain the integrity of the tube during the drawing process. For a tube made of borosilicate glass, for example, the temperature may be in the range of from about 700° C. to about 900° C. Low temperature glasses, such as soda lime glass may be heated to a temperature of about 450° C. to about 600° C. for drawing. If the tube is made of a polymer, the drawing temperature may be about 200° C. or less.

The feed rate of the preform and the pull rate of the drawn tube are balanced to achieve the proper tension and diameter at the drawing temperature. If the tension on the tube is too high, the drawn tube fiber may break, and if the tension is too low, the diameter of the drawn tube may not be uniform. For example, a draw rate of from about 2 m/min to about 8 m/min may be suitable. A starting length of the preform is typically in the range of from about 300 mm to about 1 m, although other lengths are possible. During the drawing process, the length of the drawn preform may increase several-fold.

The capillary tube may have inner and outer walls that define a circular transverse cross-section, although it is possible for one or both of the walls to have a non-circular transverse cross-section, such as a polygonal transverse cross-section (e.g., a hexagonal cross-section or a diamond-like cross-section). In such a case, the outer diameter may be an outer lateral dimension (e.g., outer width), and the inner diameter may be an inner lateral dimension (e.g., inner width). Similarly, the conductive rods may have a circular or non-circular transverse cross-section. It should therefore be understood that the term "diameter" is used herein for example only and is not intended to limit the rod, tube or bundle to a circular transverse cross-section, as other geometries are possible; accordingly, the more general term "width" or "thickness" may be substituted throughout the specification for "diameter."

With each draw, the outer diameter of the drawn tube is reduced while the number of channels increases, since additional segments are incorporated into each draw. Furthermore, the spacing between adjacent channels, which depends on the wall thickness of the drawn tubes, decreases with each draw. Ultimately, the density of the LED array depends on this spacing, which typically ranges from tens of nanometers to tens of microns. Generally speaking, the spacing between adjacent channels of the final drawn bundle, or the wall thickness after the final draw, ranges from about 50 microns to about 500 microns. The spacing may also be from about 100 microns to about 400 microns, or from about 150 microns to about 300 microns.

The reduction in the channel diameter and the spacing between channels with each draw allows an increasing number of drawn fibers to be bundled and drawn and/or fused in successive draws. The final drawn bundle may include a remarkably high number density of channels, where each channel may contain a conductive rod of from about 1 micron to about 100 microns in diameter. The final drawn bundle may be cut transversely (if desired) to form a nonconductive matrix including a high density of conductive rods. For example, the nonconductive matrix may include from about 1,000 to about 10,000 conductive rods within an area of one square centimeter. Generally speaking, the number density of conductive rods within the nonconductive matrix is at least about 1,000 rods/cm$^2$, and it may be at least about 2,500 rods/cm$^2$. In some embodiments, the number density of rods may be at least about 5,000 rods/cm$^2$. Using drawable conductive rods, the number density may be as high as about 100,000,000 rods/cm$^2$.

Example 1

The thermal diffusivity of ten glass-tungsten rod composite specimens were measured using a flash diffusivity apparatus. An 8 ms pulse from a 2.4 kW Xe lamp (Acute 2-2400, Profoto) positioned about 300 mm from the specimen was employed for excitation. Heat propagation was monitored on the backside of the specimen using a 2 mm$^2$ In—Sb detector. A 2-mm-thick sample of bulk SiC with a known thermal diffusivity of 0.0354 cm$^2$/s was used as a calibration standard.

Referring to Table 1, six of the composite specimens evaluated in the thermal diffusivity experiments include tungsten rods of about 100 microns in diameter, and four of the specimens include tungsten rods of about 75 microns in diameter. The number of conductive rods embedded within each glass matrix ranged from 352 to 982, and the overall diameter of the glass-tungsten rod composites ranged from about 0.4 mm to about 0.7 mm.

TABLE 1

| | | | | | | Results | | |
|---|---|---|---|---|---|---|---|---|
| | | | # of | | Sample | Type | | % |
| | $D_{wire}$ | $D_{fiber}$ | wires | | Avg. | Avg. | | increase |
| Sample | μm | mm | Stated | Actual | cm²/sec | cm²/sec | Std. Dev | over glass |
| 1 | 100 | 0.68 | 400 | 396 | 0.023167 | | | |
| 2 | 100 | 0.68 | 400 | 396 | 0.021383 | 0.022275 | 0.000941 | 293% |
| 3 | 100 | 0.48 | 700 | 720 | 0.034700 | | | |
| 4 | 100 | 0.48 | 700 | 720 | 0.035517 | 0.035108 | 0.003004 | 462% |
| 5 | 100 | 0.40 | 1000 | 982 | 0.049183 | | | |
| 6 | 100 | 0.40 | 1000 | 982 | 0.054900 | 0.052042 | 0.003004 | 685% |
| 7 | 75 | 0.68 | 700 | 669 | 0.023283 | | | |
| 8 | 75 | 0.68 | 700 | 669 | 0.023083 | 0.023183 | 0.000134 | 305% |
| 9 | 75 | 0.48 | 350 | 352 | 0.015283 | | | |
| 10 | 75 | 0.48 | 350 | 352 | 0.015133 | 0.015208 | 0.000090 | 200% |
| glass | 0 | 0 | 0 | 0 | | 0.007600 | 0.000173 | |

Figure 11:
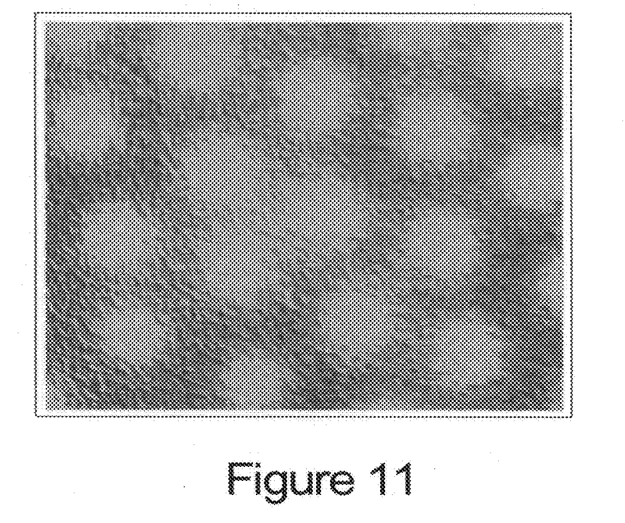
FIG. 11 is a near-infrared image of tungsten rods embedded in a glass matrix.

Referring to the data shown in Table 1 and in FIG. 11, the results indicate that the thermal diffusivity of the heat sink can be increased by increasing the diameter of the rods and/or the number of conducting rods in the matrix. The greatest increase in thermal diffusivity over that of glass was achieved by Samples 5 and 6, which included nearly 1000 tungsten rods of about 100 microns in diameter (each) in a glass matrix of about 0.4 mm in diameter. A higher density of the rods (that is, a reduced spacing between the rods) also contributes to an increased thermal diffusivity of the composite. However, when the conductive rods are in very close proximity (e.g., when the distance between the rods is smaller than the diameter of the rods), a reduction in thermal anisotropy may occur, and the capacity of the composite to provide highly anisotropic heat conduction along the longitudinal direction of the rods may be diminished.

Example 2

Near-infrared (NIR) imaging is employed to confirm that tungsten rods embedded in a glass matrix are effective in removing heat anisotropically from an LED. To carry out the imaging experiments, a 2 mm-thick composite of tungsten rods embedded in a glass matrix is irradiated with NIR radiation. Referring to FIG. 12, the tungsten rods are about 100 microns in diameter and are separated by about 100 microns of glass. The conditions of the irradiation are similar to those for the diffusivity experiments, except that the detection is carried out with an InSb NIR camera. Direct imaging of the heat propagation shows that the tungsten rods play the role of heat pipes for longitudinal conduction of heat. The heat removed from an LED may be transferred to a heat sink and/or removed via convection from exposed portions of the rods, as described previously.

Although the present invention has been described in considerable detail with reference to certain embodiments thereof, other embodiments are possible without departing from the present invention. The spirit and scope of the appended claims should not be limited, therefore, to the description of the preferred embodiments included here. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A close-packed array of light emitting devices, the close-packed array comprising:
    a nonconductive substrate having a plurality of elongate channels extending therethrough from a first side to a second side, wherein each of the elongate channels in at least a portion of the substrate includes a conductive rod therein, the conductive rods comprising first conductive rods and second conductive rods; and
    a plurality of light emitting diodes on the first side of the substrate, each light emitting diode being in physical contact with at least one of the first conductive rods and in electrical contact with at least one of the second conductive rods,
    wherein the conductive rods have a density over the substrate of at least about 1,000 rods per square centimeter.

2. The close-packed array of claim 1, wherein a ratio of light emitting diodes to conductive rods is between 1:2 and 1:20.

3. The close-packed array of claim 2, wherein the ratio is between 1:3 and 1:8.

4. The close-packed array of claim 1, wherein each of the elongate channels over an entirety of the substrate includes one of the conductive rods therein.

5. The close-packed array of claim 1, wherein each of the elongate channels in a second portion of the substrate does not include one of the conductive rods therein, the elongate channels in the second portion being configured for convective flow therethrough.

6. The close-packed array of claim 1, wherein the density of the conductive rods over the substrate is at least about 2,500 rods per square centimeter.

7. The close-packed array of claim 6, wherein the density of the conductive rods over the substrate is at least about 5,000 rods per square centimeter.

8. The close-packed array of claim 1, wherein at least one wire extends from the light emitting diode to at least one of the second conductive rods to provide the electrical contact.

9. The close-packed array of claim 1, wherein the conductive rods further comprise at least one third conductive rod in an elongate channel, the third conductive rod not being in electrical or physical contact with any of the light emitting diodes.

10. The close-packed array of claim 1, wherein each of the conductive rods comprises a width of between about 1 micron and 100 microns.

11. The close-packed array of claim 10, wherein the width is less than a spacing between adjacent conductive rods.

12. The close-packed array of claim 11, wherein the spacing is between about 50 microns and 500 microns.

13. The close packed array of claim 1, wherein the rods are cylindrical.

14. The close-packed array of claim 1, wherein the light emitting diodes are not in contact with the substrate.

15. The close-packed array of claim 1, further comprising a plurality of conical openings in the first side of the substrate contiguous with the channels, each conical opening enlarging a width of an end of one of the channels.

16. The close-packed array of claim 15, wherein the conical opening includes a reflective coating deposited thereon.

17. The close-packed array of claim 1, further comprising a heat sink on the second side of the substrate in thermal contact with the conductive rods.

18. The close-packed array of claim 17, wherein the heat sink is spaced apart from the substrate, the conductive rods being configured for exposure to a convective flow between the second side of the substrate and the heat sink.

19. The close-packed array of claim 1, wherein the conductive rods are configured for exposure to a convective flow between the first side of the substrate and the plurality of light emitting diodes.

20. The close-packed array of claim 1, further comprising a phosphor glass disposed in opposition to the first side of the substrate.

21. The close-packed array of claim 1, wherein the nonconductive substrate comprises glass.

22. The close-packed array of claim 1, wherein the conductive rods comprise a thermally and electrically conductive material.

23. The close-packed array of claim 22, wherein the thermally and electrically conductive material comprises a refractory metal selected from the group consisting of molybdenum and tungsten.

24. The close-packed array of claim 22, wherein the second conductive rods comprise the thermally and electrically conductive material, and the first conductive rods comprise a thermally conductive and electrically insulating material.

25. The close-packed array of claim 24, wherein the thermally conductive and electrically insulating material comprises a ceramic selected from the group consisting of aluminum nitride and aluminum oxide.

26. The close-packed array of claim 1, wherein the plurality of channels are arranged in an ordered array.

27. The close-packed array of claim 1, wherein each of the conductive rods comprises a width of between about 1 micron and 100 microns, the width being less than a spacing between adjacent conductive rods, and the density of the conductive rods over the substrate being at least about 2,500 rods per square centimeter, wherein a ratio of light emitting diodes to conductive rods is between 1:2 and 1:20, and wherein the light emitting diodes are not in contact with the substrate, further comprising a plurality of conical openings in the first side of the substrate contiguous with the elongate channels, each conical opening enlarging a width of an end of one of the channels and including a reflective coating deposited thereon, further comprising a heat sink on the second side of the substrate in thermal contact with the conductive rods, wherein the nonconductive substrate comprises glass, the conductive rods comprise a refractory metal selected from the group consisting of molybdenum and tungsten, and the plurality of channels are arranged in an ordered array.

28. The close-packed array of claim 27, wherein the heat sink is spaced apart from the substrate, the conductive rods being configured for exposure to a convective flow between the second side of the substrate and the heat sink, wherein the conductive rods are configured for exposure to a convective flow between the first side of the substrate and the plurality of light emitting diodes, and wherein each of the elongate channels in a second portion of the substrate does not include one of the conductive rods therein, the elongate channels in the second portion being configured for convective flow therethrough.

* * * * *